United States Patent
Satoh et al.

(10) Patent No.: US 6,839,218 B2
(45) Date of Patent: Jan. 4, 2005

(54) CERAMIC ELECTRONIC COMPONENT HAVING LEAD WIRES

(75) Inventors: Kazuharu Satoh, Tokyo (JP); Toshiki Otsuki, Tokyo (JP); Yutaka Miura, Tokyo (JP); Akitoshi Yoshii, Tokyo (JP); Takashi Kamiya, Tokyo (JP)

(73) Assignee: TDK Corporation, Tokyo (JP)

(*) Notice: Subject to any disclaimer, the term of this patent is extended or adjusted under 35 U.S.C. 154(b) by 163 days.

(21) Appl. No.: 10/219,738

(22) Filed: Aug. 16, 2002

(65) Prior Publication Data

US 2003/0038160 A1 Feb. 27, 2003

(30) Foreign Application Priority Data

Aug. 22, 2001 (JP) ........................................ 2001-251150

(51) Int. Cl.$^7$ .............................................. H01G 4/228
(52) U.S. Cl. .................................... 361/306.1; 361/309
(58) Field of Search .............................. 361/301.4, 303, 361/306.1, 306.3, 308.1, 309, 311–313, 321.2, 329, 330

(56) References Cited

U.S. PATENT DOCUMENTS

| 6,201,683 | B1 | * | 3/2001 | Yamada et al. .......... 361/308.1 |
| 6,356,431 | B1 | * | 3/2002 | Lin et al. .................... 361/307 |
| 6,400,551 | B1 | * | 6/2002 | Lin et al. ................. 361/301.3 |
| 6,438,827 | B1 | * | 8/2002 | Nakagawa et al. ........... 29/860 |

FOREIGN PATENT DOCUMENTS

| JP | 3-178110 | 8/1991 |
| JP | 4-352406 | 12/1992 |
| JP | 5-36559 | 2/1993 |

* cited by examiner

Primary Examiner—Anthony Dinkins
(74) Attorney, Agent, or Firm—Oblon, Spivak, McClelland, Maier & Neustadt, P.C.

(57) ABSTRACT

The present invention relates to a radial-type ceramic electronic component that can prevent cracking in the ceramic substrate and detachment of the terminal electrodes due to the contractile stresses in the solder. A ceramic electronic component element 1 is equipped with terminal electrodes 11 and 12 on either end of a ceramic substrate 10. A pair of lead wires 2 and 3 are soldered to the terminal electrodes 11 and 12. The support parts 2B and 3B of the lead wires 2 and 3 are bent from the soldering parts 2A and 3A in a direction away from the terminal electrodes 11 and 12.

14 Claims, 9 Drawing Sheets

CERAMIC ELECTRONIC COMPONENT HAVING LEAD WIRES

TECHNICAL FIELD

The present invention relates to ceramic electronic components with lead wires, more particularly relates to improvements thereto.

BACKGROUND ART

Ceramic electronic components with lead wires are generally termed "radial lead-type ceramic electronic components." The ceramic electronic components with lead wires have a structure wherein each of a pair of lead wires is soldered onto a ceramic electronic component element, such as a multilayer ceramic capacitor. For example, as shown in FIG. 13, the lead wires 2 and 3 are soldered, respectively, using soldering parts 2A and 3A, to the terminal electrodes 11 and 12 of a ceramic electronic component element 1. After this, the ceramic electronic component 1, including the soldering parts 2A and 3A, is coated with a insulating resin as an outside coating layer 4.

As is shown in FIG. 13, structures wherein support parts 2B and 3B are continuous with the soldering parts 2A and 3A and extending linearly therefrom are used as the lead wires 2 and 3. (See Japanese Patent Publication 1991-178110A, Japanese Patent Publication 1992-352408A, and Japanese Patent Publication 1993-36559A.) In addition, as is shown in FIG. 14, structures wherein the support parts 2B and 3B are bent aslant towards the center on the bottom of the ceramic electronic component element 1 from the soldering parts 2A and 3A are also used.

The support parts 2B and 3B of the lead wires 2 and 3 are laid out with a prescribed spacing so that they can be held by taping to a carrier tape. When applying solder to the ceramic electronic component element 1 for the lead wires 2 and 3, the ceramic electronic component element 1 is disposed between the soldering parts 2A and 3A of the pair of lead wires 2 and 3, which is held on the carrier tape, and with the ceramic electronic component element 1 faced downwards, the ceramic electronic component element 1 is dipped in a fountain of molten solder, thereby applying solder between the soldering parts 2A and 3A of the lead wires 2 and 3, and the terminal electrodes 11 and 12.

When the ceramic electronic component element 1 is dipped in the molten solder, then, as shown in FIG. 15, a large amount of molten solder 5A and 5B accumulates between the surfaces of these support parts 2B and 3B, which are continuous in a straight line from the soldering parts 2A and 3A and the lower corners of the ceramic electronic component element 1 that includes the terminal electrodes 11 and 12. In particular, as is shown in FIG. 16, bending the support parts 2B and 3B so as to angle inwards on the bottom side of the ceramic electronic component element 1 from the soldering parts 2A and 3A increases the amount of molten solder that adheres.

When the molten solder 5A and 5B hardens, the solder condensation produces a contractile stress. In particular, large contractile stresses will be produced when a large amount of the solder 5A and 5B is adhered. These contractile stresses act as forces to pull the terminal electrodes 11 and 12 off of the ceramic electronic component element 1, causing cracks in the ceramic substrate 10 at the interfaces between the ceramic substrate 10 and the terminal electrodes 11 and 12, and detaching the terminal electrodes 11 and 12 from the ceramic substrate 10, resulting in defective parts.

Conventionally, no attention has been paid to the effects of the contractile stresses of the solder 5A and 5B on the ceramic electronic component element 1. In regards to this, when the types of ceramic electronic component element 1 was ignored and five lots of test ceramic electronic components shaped as shown in FIG. 16 were produced with 200 pieces per lot, with the support parts 2B and 3B of the lead wires 2 and 3 bent to an angle of 20°, and the soldering process was performed on each lot, one lot had solder cracking in more than 190 units, and another lot had solder cracking in more than 70 units.

SUMMARY OF THE INVENTION

An object of the present invention is to provide a ceramic electronic component with lead wires that can prevent cracking in the ceramic substrate and detachment of the terminal electrodes due to the contractile stresses in the solder.

In order to achieve the object described above, the ceramic electronic component of the present invention includes a ceramic electronic component element and a pair of lead wires. The ceramic electronic component element includes a ceramic substrate and a pair of terminal electrodes which are provided on the opposite ends of the ceramic substrate.

Each of the pair of lead wires includes a soldering part and a support part. The soldering parts are soldered to the terminal electrodes of the ceramic electronic component element. The support parts are continuous with the soldering parts, and are bent outwards from the soldering parts in a direction away from the terminal electrodes.

As described above, the ceramic electronic component of the present invention includes a ceramic electronic component element. The ceramic electronic component element includes a ceramic substrate and a pair of terminal electrodes which are provided on the opposite ends of the ceramic substrate. This makes it possible to obtain an electronic component element that has the electrical characteristics of ceramic substrates and characteristics corresponding to the internal electrode structure formed in the ceramic substrate, typically a multilayer ceramic electronic component element, and, in particular, a multilayer ceramic capacitor, where the electrical characteristics thereof are connected to the outside through a pair of terminal electrodes.

The ceramic electronic component according to the present invention also has a pair of lead wires, and each of the lead wires includes a soldering part. The soldering parts are soldered to the terminal electrodes of the ceramic electronic component element. This structure makes it possible to obtain a radial lead-type ceramic electronic component.

Each of the lead wires includes a support part. The support parts are continuous with the soldering parts, and are bent outwards from the soldering parts in a direction away from the terminal electrodes. This structure makes it possible to avoid adhesion of more molten solder than is required between the surfaces of the support parts and the lower corners of the ceramic electronic component element that includes the terminal electrodes, when the ceramic electronic component element and the soldering parts of the lead wires are dipped in molten solder such as jet solder, for soldering the soldering parts to the terminal electrodes of the ceramic electronic component element. As a result, it is possible to reduce the contractile stress that occurs when the molten solder hardens, making it possible to avoid such problems that the ceramic substrate is cracked to cause detachment of the terminal electrodes at the interfaces between the ceramic substrate and the terminal electrodes even if the base material of the ceramic substrate is weak.

As a specific embodiment, the lead wires may have the soldering parts which extend upwards from the support parts, and the support parts which are bent obliquely outwards from the soldering parts in a direction away from the terminal electrodes.

As another embodiment, the lead wires may have the soldering parts extend upwards from the support parts, and the support parts which are bent from the soldering parts in a lateral direction away from the terminal electrodes.

As an yet another embodiment, the support parts of the lead wires may be bent from the soldering parts, at a position higher the lower corners of the ceramic electronic element, in a lateral direction away from the terminal electrodes.

As an yet another embodiment, the lead wires may have the soldering parts which extend downwards parallel to the support parts, and the support parts which are bent from the soldering parts in a lateral direction away from the terminal electrodes.

As an yet another embodiment, the soldering parts may extend downwards parallel to the support parts and the ends of the soldering parts do not reach the lower corners of the ceramic electronic component element.

As an yet another embodiment, the soldering parts of the lead wires may have flat surfaces.

DETAILED DESCRIPTION OF THE PREFERRED EMBODIMENTS

Figure 1:
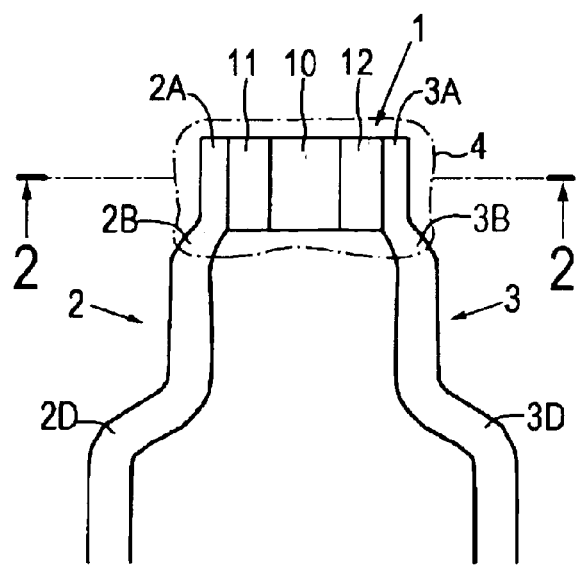
FIG. 1 is a drawing showing an example of a ceramic electronic component with lead wires, according to the present invention.
Figure 2:
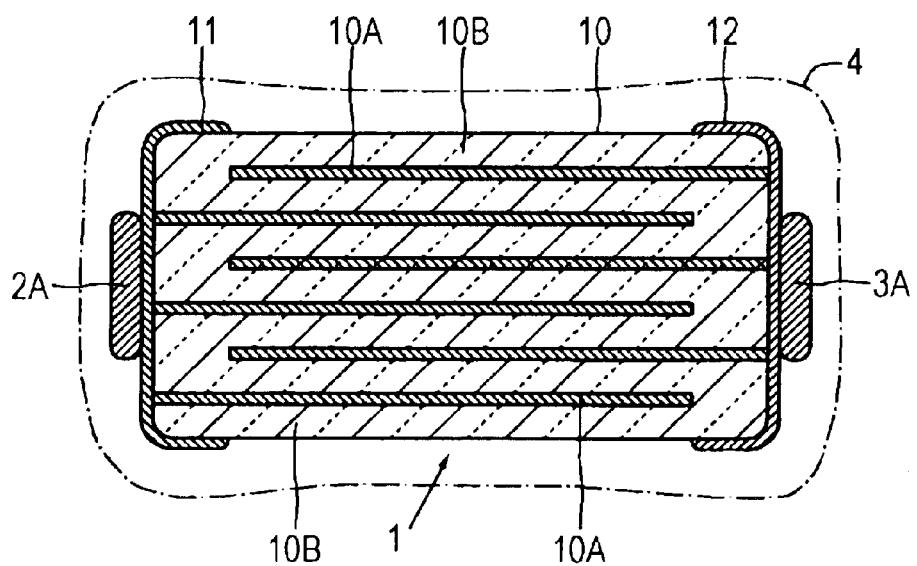
FIG. 2 is an enlarged cross-sectional drawing along the line 2—2 in FIG. 1.

FIGS. 1 and 2 show a ceramic electronic component with lead wires, comprising a multilayer ceramic capacitor. The ceramic electronic component shown here includes a ceramic electronic component element 1 and a pair of lead wires 2 and 3. The ceramic electronic component element 1 comprises a ceramic substrate 10 and a pair of terminal electrodes 11 and 12, and the terminal electrodes 11 and 12 are provided on the opposite ends of the ceramic substrate 10.

The pair of lead wires 2 and 3 comprise soldering parts 2A and 3A and support parts 2B and 3B, respectively. The soldering parts 2A and 3A are respectively soldered to the terminal electrodes 11 and 12 of the ceramic electrode part element 1. The support parts 2B and 3B are continuous with the soldering parts 2A and 3A, and are bent outwards from the soldering parts 2A and 3A in a direction away from the terminal electrodes 11 and 12.

As described above, the ceramic electronic component according to the present invention includes a ceramic electronic component element 1. This ceramic electronic component element 1 includes a ceramic substrate 10 and a pair of terminal electrodes 11 and 12, where these terminal electrodes 11 and 12 are provided on the opposite ends of the ceramic substrate 10. Consequently, it is possible to obtain an electronic component element having electrical characteristics of the ceramic substrate 10 and characteristics that correspond to the internal electrode structure formed in the ceramic substrate 10, typically a ceramic electronic component elements 1, which comprises a multilayer ceramic capacitor and has the electrical characteristics connected to the outside through the pair of terminal electrodes 11 and 12.

The ceramic electronic component according to the present invention also has a pair of lead wires 2 and 3, and the lead wires 2 and 3 respectively have soldering parts 2A and 3A. The soldering parts 2A and 3A are soldered to the terminal electrodes 11 and 12 of the ceramic electronic component element 1. This structure makes it possible to obtain radial lead-type ceramic electronic components.

The ceramic electronic component element 1 shown in the embodiment in the figure is a multilayer ceramic capacitor element. This multilayer ceramic capacitor element, as is shown in FIG. 2, has a structure in which a plurality of internal electrodes 10A and a plurality of ceramic dielectric layers 10B are alternately layered within a ceramic substrate 10 of a rectangular parallelepiped. One of adjacent internal electrodes 10A and 10A is electrically connected at one end to the terminal electrode 11, and the other is electrically connected at one end to the terminal electrode 12.

The soldering parts 2A and 3A of the lead wires 2 and 3 are fixed, by soldering, to the terminal electrodes 11 and 12 of the ceramic electronic component element 1, respectively. The entire ceramic electronic component element 1, including the soldering parts 2A and 3A, are covered by an outside coating layer 4 made from an insulating resin. The support parts 2B and 3B that are continuous with the soldering parts 2A and 3A are led out from the outside coating layer 4 in a parallel direction, to form a so-called radial lead-type ceramic electronic component.

Each of the lead wires 2 and 3 is provided with a kink 2D, 3D that controls the height of the positioning of the ceramic electronic component element 1 relative to the printed circuit board. The kinks 2D and 3D in the figures are obtained by bending the lead wires 2 and 3.

Figure 3:
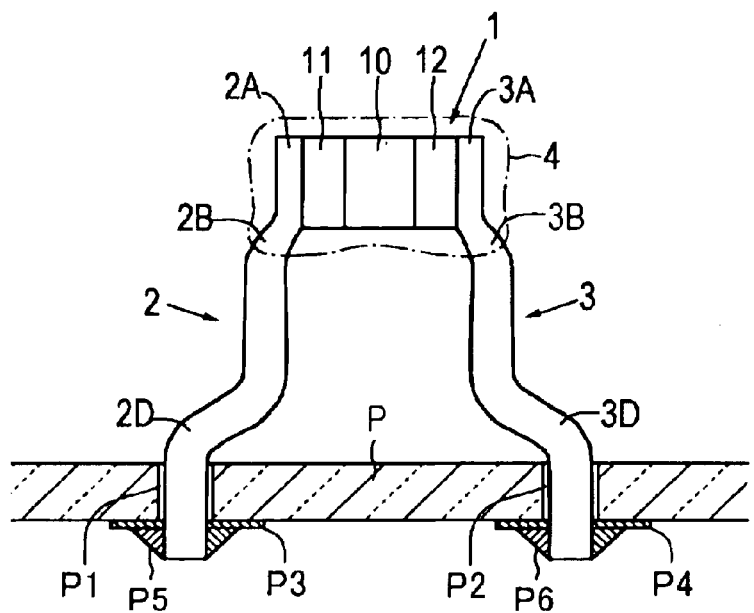
FIG. 3 is a drawing showing the state of use of the ceramic electronic component with lead wires shown in FIGS. 1 and 2.

FIG. 3 shows the use of the ceramic electronic component with lead wires shown in FIG. 1 and FIG. 2. Since the lead wires 2 and 3 are provided with kinks 2D and 3D, the height of the positioning of the ceramic electronic component element 1 is controlled with respect to the printed circuit board P. The lead wires 2 and 3 are inserted into holes P1 and P2 from one side of the printed circuit board P, and are soldered (P5 and P6) to the conductive patterns P3 and P4 on the other side.

Figure 4:
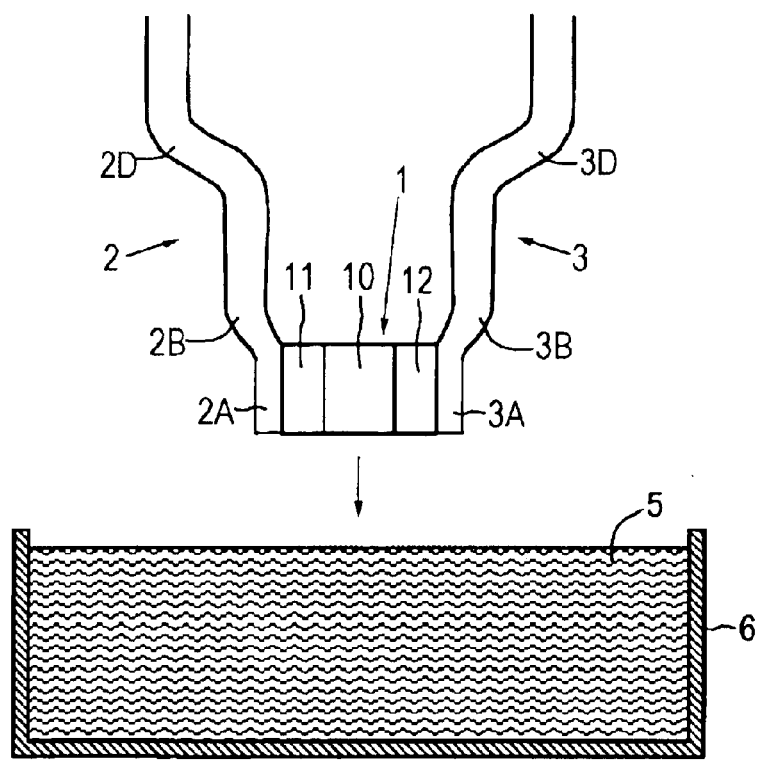
FIG. 4 is a drawing showing the soldering process for obtaining the ceramic electronic component shown in FIGS. 1 and 2.
Figure 5:
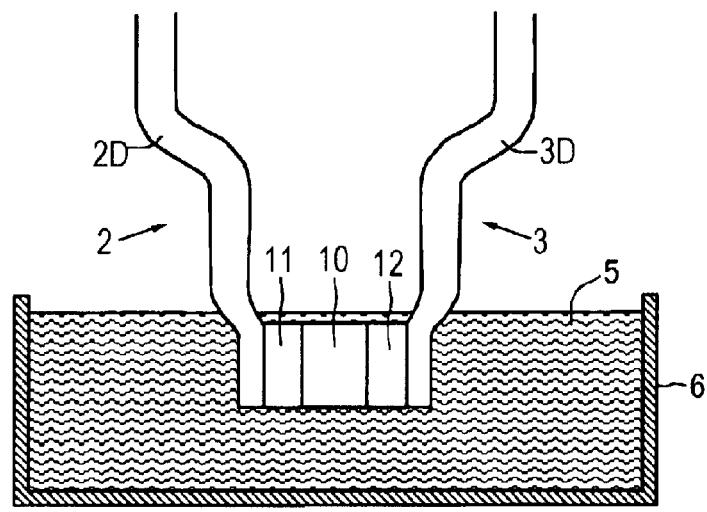
FIG. 5 is a drawing showing the process after the process shown in FIG. 4.
Figure 6:
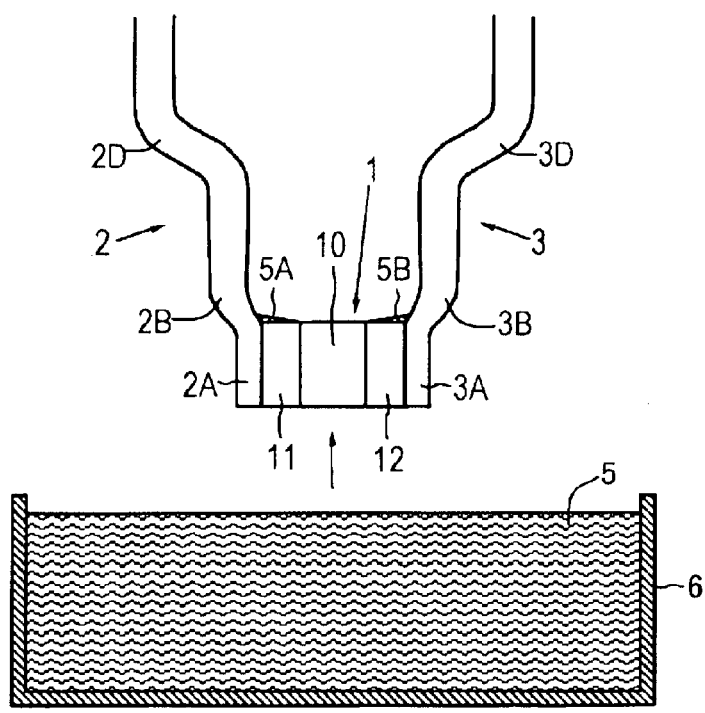
FIG. 6 is a drawing showing the process after the process shown in FIG. 5.

FIGS. 4 through 6 show the soldering process for obtaining the ceramic electronic component shown in FIGS. 1 and 2. As shown in FIG. 4, when soldering the lead wires 2 and 3 to the ceramic electrical component element 1, the ceramic electronic component element 1 is sandwiched between the soldering parts 2A and 3A of the pair of lead wires 2 and 3 held by a carrier tape (not shown). At this stage, the ceramic electronic component element 1 is only temporarily attached to the lead wires 2 and 3, and have not been soldered yet.

Next, as shown in FIG. 5, with the ceramic electronic component element 1 facing downward, the carrier film (not shown) is advanced, and the ceramic electronic component element 1 is dipped in a jet of molten solder 5 contained in a solder tank 6. Note that in this specification the terms "up" and "down" are as viewed in the figure.

After the solder dip, the ceramic electronic component element 1 is removed from the molten solder 5, as shown in FIG. 6, whereby the soldering parts 2A and 3A of the lead wires 2 and 3 and the terminal electrode parts 11 and 12 are affixed together by solder 5A and 5B.

Figure 7:
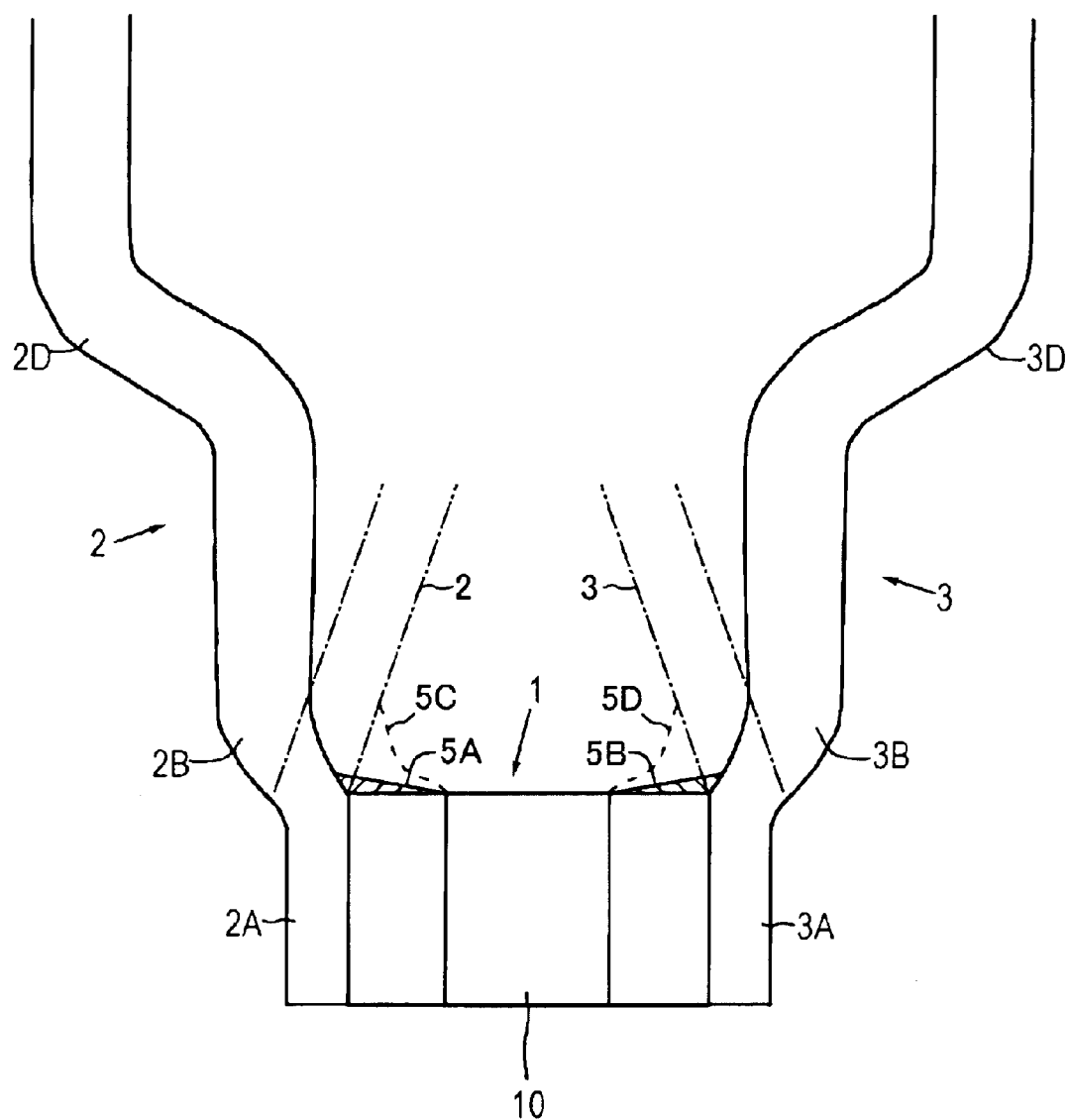
FIG. 7 is an enlarged drawing of the ceramic electronic component obtained by using the processes shown in FIGS. 4 through 6.

The lead wires 2 and 3 include, respectively, support parts 2B and 3B. These support parts 2B and 3B are continuous with the soldering parts 2A and 3A, and are bent outwards from the soldering parts 2A and 3A in a direction away from the terminal electrodes 11 and 12. This structure makes it possible to avoid adhesion of excessive molten solder 5A and 5B between the surfaces of the support parts 2B and 3B, and the lower corners of the ceramic electronic component element 1 which includes the terminal electrodes 11 and 12, as shown in the enlarged view in FIG. 7, when the ceramic electronic component element 1 and the soldering parts 2A and 3A of the lead wires 2 and 3 are dipped into the molten solder 5 such as a jet solder (See FIG. 5) and then removed therefrom (See FIG. 6) for soldering the soldering parts 2A and 3A of the lead wires 2 and 3 to the terminal electrodes 11 and 12 of the ceramic electronic component element 1. The part that is shown by the alternate short and long dash line in FIG. 7 shows the state where solder 5C and 5D will be attached when the conventional lead wires 2 and 3 are used. The solder 5A and 5B of the present invention, shown by the solid line, is substantially less than the amount of solder 5C and 5D applied conventionally.

Consequently, the present invention reduces the contractile stress that occurs when the molten solder 5A and 5B hardens, making it possible to prevent cracking in the ceramic substrate 10 even if the base material of the ceramic substrate 10 is weak. As a result, it is possible to avoid such problems that the ceramic substrate 10 is cracked to cause detachment of the terminal electrodes 11 and 12 at the interface between the ceramic substrate 10 and the terminal electrodes 11 and 12.

The embodiments of the present invention can be broadly divided into three types depending on the bending configuration of the lead wires 2 and 3. In the first type, the support parts 2B and 3B are bent obliquely outwards in a direction away from the electrode terminals 11 and 12. In the second type, the support parts 2B and 3B are continuous with the soldering parts 2A and 3B rising upwards, and are bent in a lateral direction away from the terminal electrodes 11 and 12. Finally in the third type, the support parts 2B and 3B are continuous with the soldering parts 2A and 3A extending downwards, and are bent in a lateral direction away from the terminal electrodes 11 and 12.

In all of these types, the support parts 2B and 3B of the lead wires 2 and 3 are bent outwards from the soldering parts 2A and 3A in a direction away from the terminal electrodes 11 and 12, fundamentally.

FIG. 1 shows the first type, where the support part 2B and 3B of the lead wires 2 and 3 are bent obliquely outwards from the soldering parts 2A and 3A in the direction away from the terminal electrodes 11 and 12, in a rounded shape with small angles including no angle zero.

Since the support parts 2B and 3B of the lead wires 2 and 3 are bent obliquely outwards from the soldering parts 2A and 3A in the direction away from the terminal electrodes 11 and 12, in a rounded shape with small angles including no angle zero, when the soldering parts 2A and 3A of the lead wires 2 and 3, and the ceramic electronic component element 1 are dipped in a molten solder 5, such as a jet solder, it is possible to avoid adhesion of excessive molten solder 5 between the surfaces of the support parts 2B and 3B, and the lower corners of the ceramic electronic component element 1, which includes the terminal electrodes 11 and 12. As a result, it is possible to reduce the contractile force that occurs when the molten solder 5A and 5B hardens, making it possible to avoid such problems that the ceramic substrate 10 is cracked to cause detachment of the terminal electrodes 11 and 12 at the interface between the ceramic substrate 10 and the terminal electrodes 11 and 12, even if the base material of the ceramic substrate 10 is weak. (See FIGS. 4 through 6.)

Figure 8:
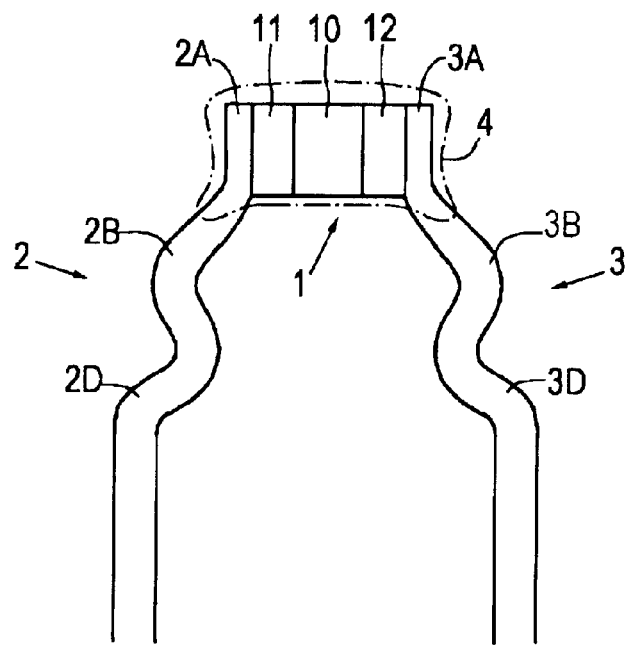
FIG. 8 is a drawing showing another embodiment of a ceramic electronic component with lead wires according to the present invention.

FIG. 8 shows another embodiment of a ceramic electronic component belonging to the first type. In this embodiment, the support parts 2B and 3B are bent to an angle θ of about 60°. In this case, the starting points where the supporting parts 2B and 3B are bent from the soldering parts 2A and 3A are separated obliquely to the outside of the lower corners of the ceramic electronic component element 1, and thus it is possible to prevent the adhesion of excessive molten solder 5A and 5B between the support parts 2B and 3B and the lower corners of the ceramic electronic component element 1 including the terminal electrodes 11 and 12.

In the first type, the soldering parts 2A and 3B are formed into flat surfaces. With these lead wires 2 and 3, the terminal electrodes 11 and 12 of the ceramic electronic component element 1 can be attached in close contact to the soldering parts 2A and 3A, making it possible to achieve a stable assembly.

Figure 9:
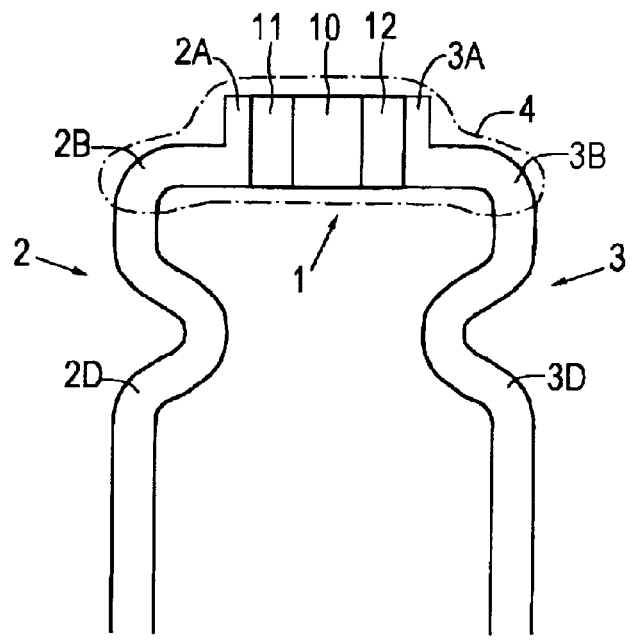
FIG. 9 is a drawing showing yet another embodiment of a ceramic electronic component with lead wires according to the present invention.

FIG. 9 shows an embodiment of a ceramic electronic component belonging to the second type. In this second type ceramic electronic component, lead wires 2 and 3 have soldering parts 2A and 3A which extend upwards from the support parts 2B and 3B, and the support parts 2B and 3B are bent from the soldering parts 2A and 3A in a lateral direction away from the terminal electrodes 11 and 12. In these lead wires 2 and 3, the starting points of the bends in the support part 2B and 3B are separated orthogonally outwards from the lower corners of the ceramic electrode component element 1, and thus there will not be an excessive amount of molten solder 5A and 5B adhered to the inner region from the lower corners of the ceramic electronic component element 1.

Figure 10:
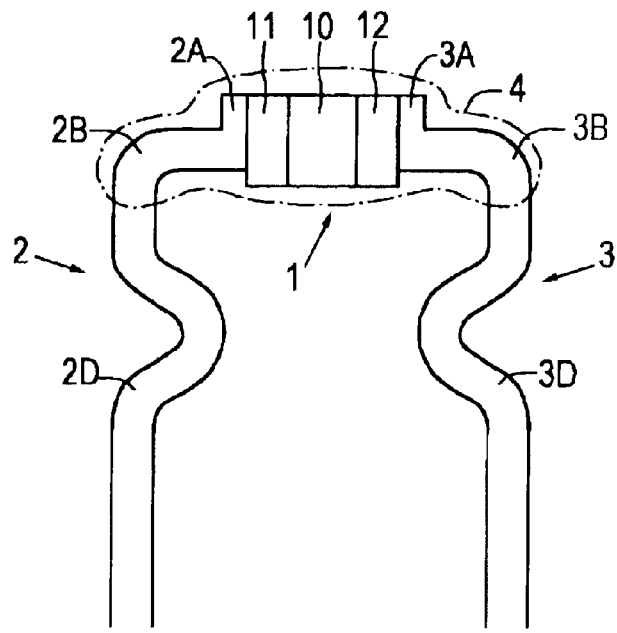
FIG. 10 is a drawing showing yet another embodiment of a ceramic electronic component with lead wires according to the present invention.

FIG. 10 shows another embodiment of a ceramic electronic component belonging to the second type. In this embodiment, the starting points of the bends in the support parts 2B and 3B are higher than the lower corners of the ceramic electronic component element 1, and are extended from the soldering parts 2A and 3A in a direction away from the terminal electrodes 11 and 12. In this case, since the starting points of the bends in the support parts 2B and 3B are higher than the lower corners of the ceramic electrode component element 1, there will be no molten solder 5A or 5B adhered to the inner region from the lower corners of the ceramic electronic component element 1.

Also in the second type, lead wires 2 and 3 can be provided with soldering parts 2A and 3B formed into flat surfaces, so that the terminal electrodes 11 and 12 of the ceramic electronic component element 1 are attached in close contact to the soldering parts 2A and 3A. Kinks 2D and 3D are provided to control the height of the positioning of the ceramic electronic component element 1 relative to the printed circuit board.

Figure 11:
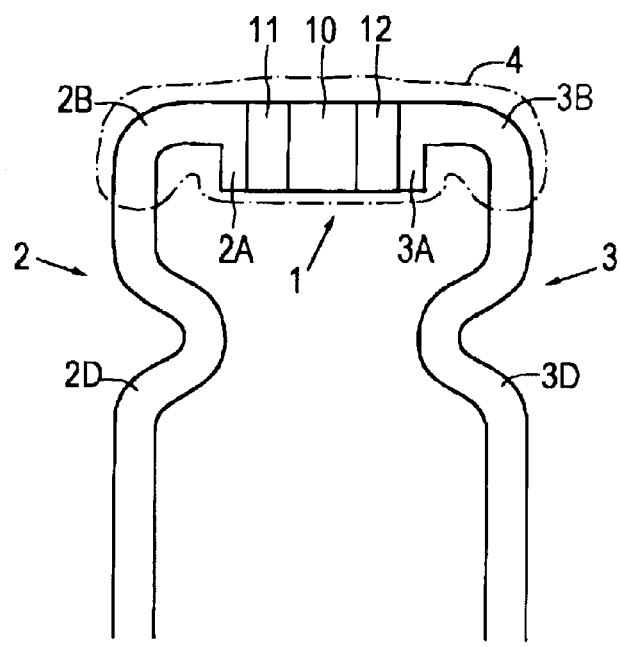
FIG. 11 is a drawing showing yet another embodiment of a ceramic electronic component with lead wires according to the present invention.

FIG. 11 shows an embodiment of a ceramic electronic component belonging to the third type. In the third type, the lead wires 2 and 3 have soldering parts 2A and 3A which extend downwards parallel to the support parts 2B and 3B, and the support parts 2B and 3B are bent from the soldering parts 2A and 3A in a lateral direction away from terminal electrodes 11 and 12. In these lead wires 2 and 3, the ends of the soldering parts 2A and 3B are lined up with the lower corners of the ceramic electronic component element 1, and thus there will not be an excessive amount of molten solder 5A and 5B adhered to the inner region from the lower corners of the ceramic electronic component element 1.

Figure 12:
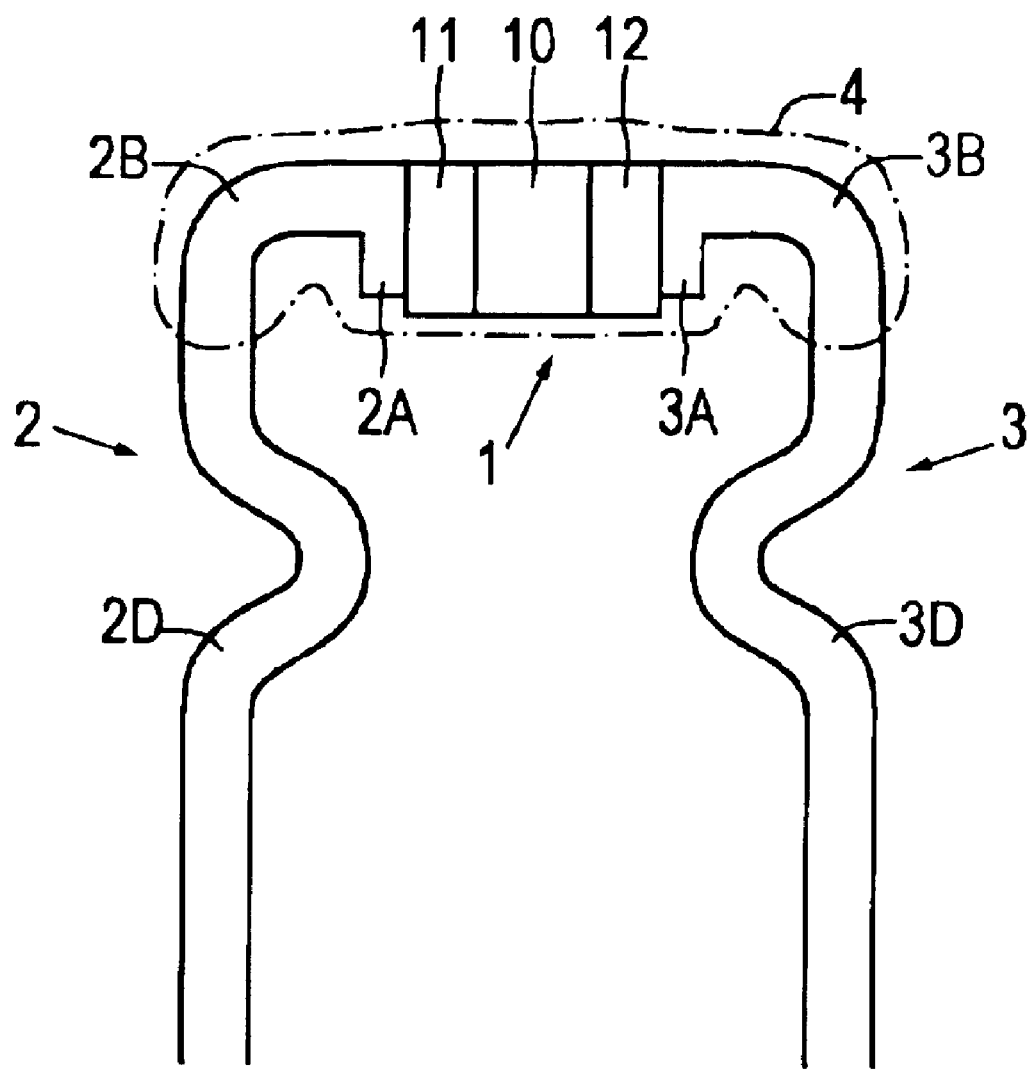
FIG. 12 is a drawing showing yet another embodiment of a ceramic electronic component with lead wires according to the present invention.
Figure 13:
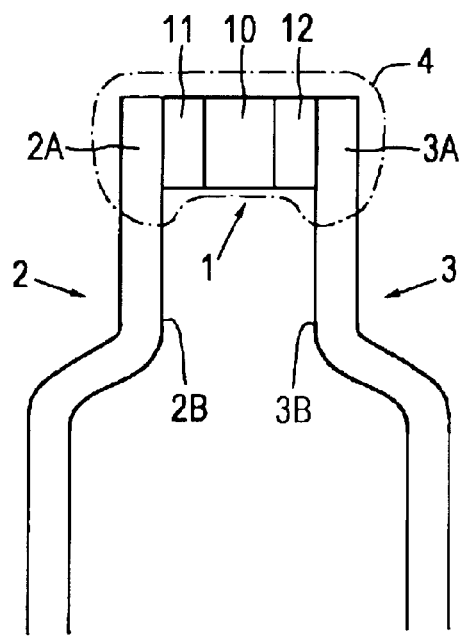
FIG. 13 is a drawing showing a conventional ceramic electronic component with lead wires.
Figure 14:
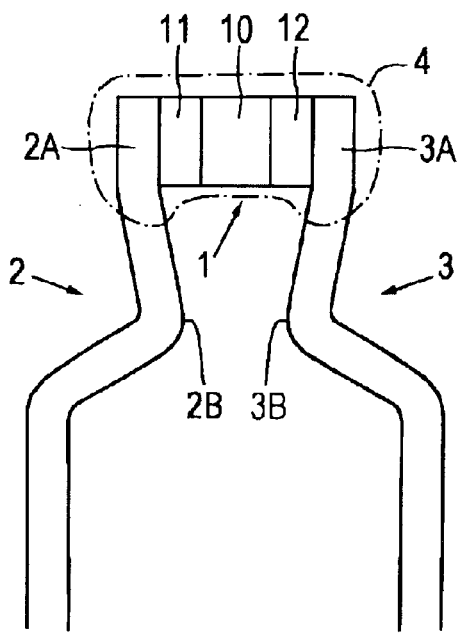
FIG. 14 is a drawing showing a conventional ceramic electronic component with lead wires.
Figure 15:
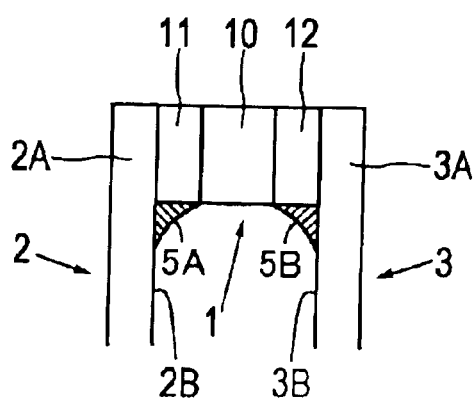
FIG. 15 is a drawing showing the status where the ceramic electronic component element shown in FIG. 14 is soldered.
Figure 16:
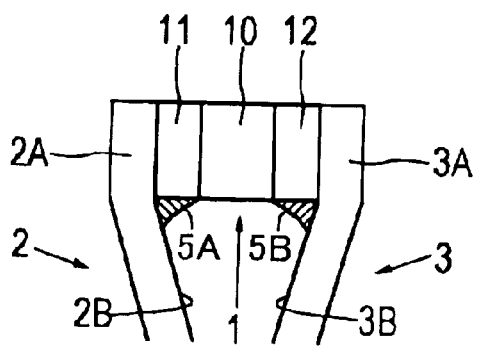
FIG. 16 is a drawing showing the status where the ceramic electronic component element shown in FIG. 15 is soldered.

FIG. 12 shows another embodiment of a ceramic electronic component belonging to the third type. In the embodiment in the figure, the lead wires 2 and 3 are formed short so that the ends of the soldering parts 2A and 3A do not reach the lower corners of the ceramic electronic component element 1. In this case, as the second type shown in FIG. 10, there will be no molten solder 5A or 5B adhered to the inner region from the lower corners of the ceramic electronic component element 1.

Also in the third type, the provision of lead wires 2 and 3 having soldering parts 2A and 3B formed into flat surfaces, make it possible terminal electrodes 11 and 12 of the ceramic electronic component element 1 are firmly held between the soldering parts 2A and 3A with a tight contact therebetween. The lead wires 2 and 3 are also provided with kinks 2D and 3D to control the height of the positioning of the ceramic electronic component element 1 relative to the printed circuit board.

The constitution described above prevents excessive molten solder 5A and 5B from adhering between the support parts 2B and 3B and the lower corners of the ceramic electronic component element 1 including the terminal electrodes 11 and 12, and prevent the molten solder 5A and 5B from adhering to the inner region from the lower corners of the ceramic electronic component element 1, and thus it is possible to prevent cracking in the ceramic substrate 10 and prevent detachment of the terminal electrodes 11 and 12 due to the contractile stresses of the solder 5A and 5B. As a result, the number of defective products can be reduced.

In the embodiments described above, a multilayer ceramic capacitor was shown as an example of a ceramic electronic component element; however, the present invention can be applied similarly to structures wherein resistor elements, inductor elements, varistor elements, and other ceramic electronic component elements are structured into radial lead type components.

INDUSTRIAL APPLICABILITY

As described above, this invention makes it possible to provide a ceramic electronic component with lead wires that can prevent cracking in the ceramic substrate and detachment of the terminal electrodes due to the contractile stresses in the solder.

What is claimed is:

1. A ceramic electronic component comprising:
   a ceramic electronic component element and a pair of lead wires, wherein
   said ceramic electronic component element includes a ceramic substrate and a pair of terminal electrodes;
   said pair of terminal electrodes are provided on opposite ends of said ceramic substrate;
   each of said pair of lead wires includes a soldering part and a support part;
   said soldering parts are soldered to said terminal electrodes of said ceramic electronic component element; and
   said support parts are continuous with said soldering parts and are bent outwards an outward distance from said soldering parts in a direction away from said pair of terminal electrodes and at least maintain the outward distance to an opposite end of each of said pair of lead wires.

2. The ceramic electronic component according to claim 1, wherein
   said soldering parts extend upwards from said support parts; and
   said support parts are bent obliquely outwards from said soldering parts in the direction away from said pair of terminal electrodes.

3. The ceramic electronic component according to claim 1, wherein
   said soldering parts extend upwards from said support parts; and
   said support parts are bent from said soldering parts in a lateral direction away from said pair of terminal electrodes.

4. The ceramic electronic component according to claim 3, wherein
   said support parts are bent from said soldering parts, at a position higher than lower corners of said ceramic electronic component element, in a lateral direction away from said pair of terminal electrode parts.

5. The ceramic electronic component according to claim 1, wherein
   said soldering parts extend downwards parallel to said support parts; and
   said support parts are bent from said soldering parts in a lateral direction away from said pair of terminal electrodes.

6. The ceramic electronic component according to claim 5, wherein
   ends of said soldering parts do not reach lower corners of said ceramic electronic component element.

7. The ceramic electronic component according to claim 1, wherein
said soldering parts have flat surfaces.

8. A ceramic electronic component comprising:
a ceramic electronic component element and a pair of lead wires, wherein
said ceramic electronic component element includes a ceramic substrate and a pair of terminal electrodes;
said pair of terminal electrodes are provided on opposite ends of said ceramic substrate;
each of said pair of lead wires includes a soldering part, a support part, and an inward inflection portion;
said soldering parts are soldered to said terminal electrodes of said ceramic electronic component element; and
said support parts are continuous with said soldering parts and are bent outwards from said soldering parts in a direction away from said pair of terminal electrodes.

9. The ceramic electronic component according to claim 8, wherein
said soldering parts extend upwards from said support parts; and
said support parts are bent obliquely outwards from said soldering parts in the direction away from said pair of terminal electrodes.

10. The ceramic electronic component according to claim 8, wherein
said soldering parts extend upwards from said support parts; and
said support parts are bent from said soldering parts in a lateral direction away from said pair of terminal electrodes.

11. The ceramic electronic component according to claim 10, wherein
said support parts are bent from said soldering parts, at a position higher than lower corners of said ceramic electronic component element, in a lateral direction away from said pair of terminal electrode parts.

12. The ceramic electronic component according to claim 8, wherein
said soldering parts extend downwards parallel to said support parts; and
said support parts are bent from said soldering parts in a lateral direction away from said pair of terminal electrodes.

13. The ceramic electronic component according to claim 12, wherein
ends of said soldering parts do not reach lower corners of said ceramic electronic component element.

14. The ceramic electronic component according to claim 8, wherein
said soldering parts have flat surfaces.

* * * * *